US010700645B2

(12) United States Patent
Banowetz et al.

(10) Patent No.: US 10,700,645 B2
(45) Date of Patent: *Jun. 30, 2020

(54) POWER AMPLIFICATION SYSTEM WITH ADAPTIVE BIAS CONTROL

(71) Applicant: SKYWORKS SOLUTIONS, INC., Woburn, MA (US)

(72) Inventors: Matthew Lee Banowetz, Marion, IA (US); Philip H. Thompson, Cedar Rapids, IA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/029,566

(22) Filed: Jul. 7, 2018

(65) Prior Publication Data

US 2018/0316316 A1      Nov. 1, 2018

Related U.S. Application Data

(63) Continuation of application No. 15/285,839, filed on Oct. 5, 2016, now Pat. No. 10,033,336.

(60) Provisional application No. 62/237,062, filed on Oct. 5, 2015.

(51) Int. Cl.
| | |
|---|---|
| *H03F 3/04* | (2006.01) |
| *H03F 1/30* | (2006.01) |
| *H03F 3/19* | (2006.01) |
| *H03F 1/02* | (2006.01) |
| *H03F 3/21* | (2006.01) |
| *H03F 3/24* | (2006.01) |
| *H03F 3/72* | (2006.01) |

(52) U.S. Cl.
CPC .......... *H03F 1/302* (2013.01); *H03F 1/0227* (2013.01); *H03F 1/0266* (2013.01); *H03F 1/30* (2013.01); *H03F 3/19* (2013.01); *H03F 3/211* (2013.01); *H03F 3/245* (2013.01); *H03F 3/72* (2013.01); *H03F 2200/102* (2013.01); *H03F 2200/111* (2013.01)

(58) Field of Classification Search
CPC .... H03F 1/0211; H03F 1/0216; H03F 1/0244; H03F 2200/511
USPC .......................................... 330/285, 296, 297
See application file for complete search history.

(56) References Cited

U.S. PATENT DOCUMENTS

| | | | | |
|---|---|---|---|---|
| 7,456,693 | B2* | 11/2008 | Zannoth | H03F 1/0205 330/285 |
| 2015/0244322 | A1* | 8/2015 | Hur | H03F 1/0211 330/296 |
| 2015/0295541 | A1* | 10/2015 | Hur | H03F 1/0227 330/295 |

(Continued)

*Primary Examiner* — Steven J Mottola
(74) *Attorney, Agent, or Firm* — Chang & Hale LLP

(57) ABSTRACT

Power amplification system with adaptive bias control. In some embodiments a power amplification system includes a power amplifier including a radio-frequency (RF) input terminal for receiving an RF signal, an RF output terminal for providing an amplified RF signal, a supply voltage terminal for receiving a power amplifier supply voltage to power the power amplifier, and one or more bias terminals for receiving one or more bias signals. The power amplification system also includes a bias controller configured to provide the one or more bias signals to the one or more bias terminals, at least one of the one or more bias signals being based on the power amplifier supply voltage.

20 Claims, 6 Drawing Sheets

(56) References Cited

U.S. PATENT DOCUMENTS

2015/0303971 A1\* 10/2015 Reisner ..................... H03F 3/24
      455/77

\* cited by examiner

POWER AMPLIFICATION SYSTEM WITH ADAPTIVE BIAS CONTROL

CROSS-REFERENCE TO RELATED APPLICATION(S)

This application is a continuation of U.S. application Ser. No. 15/285,839 filed Oct. 5, 2016, entitled POWER AMPLIFICATION SYSTEM WITH ADAPTIVE BIAS CONTROL, which claims priority to U.S. Provisional Application No. 62/237,062 filed Oct. 5, 2015, entitled POWER AMPLIFICATION SYSTEM WITH ADAPTIVE BIAS CONTROL, the disclosure of each of which is hereby expressly incorporated by reference herein in its entirety.

BACKGROUND

Field

The present disclosure generally relates to power amplifiers (PAs) and power amplification systems.

Description of the Related Art

In radio-frequency (RF) applications, an RF signal to be transmitted is typically generated by a transceiver. Such an RF signal can then be amplified by a power amplifier (PA), and the amplified RF signal can be routed to an antenna for transmission.

SUMMARY

In some implementations, the present disclosure relates to a power amplification system. The power amplification system includes a power amplifier including a radio-frequency (RF) input terminal for receiving an RF signal, an RF output terminal for providing an amplified RF signal, a supply voltage terminal for receiving a power amplifier supply voltage to power the power amplifier, and one or more bias terminals for receiving one or more bias signals. The power amplification system also includes a bias controller configured to provide the one or more bias signals to the one or more bias terminals, at least one of the one or more bias signals being based on the power amplifier supply voltage.

In some embodiments, the bias controller includes a supply voltage terminal for receiving a bias controller supply voltage to power the bias controller.

In some embodiments, the bias controller is configured to determine the power amplifier supply voltage based on the bias controller supply voltage.

In some embodiments, the bias controller further includes a power amplifier supply voltage terminal for receiving a signal indicative of the power amplifier supply voltage.

In some embodiments, the at least one of the one or more bias signals is a continuous function of the power amplifier supply voltage.

In some embodiments, the at least one of the one or more bias signals is linearly proportional to the power amplifier supply voltage.

In some embodiments, the at least one of the one or more bias signals is a discrete function of the power amplifier supply voltage.

In some embodiments, the at least one of the one or more bias signals is a first value when the power amplifier supply voltage is above a threshold and a second value when the power amplifier supply voltage is below the threshold.

In some embodiments, the at least one of the one or more bias signals is a first value when the power amplifier supply voltage rises above a first threshold and a second value when the power amplifier supply voltage drops below a second threshold.

In some embodiments, the at least one of the one or more bias signals is a first value when the power amplifier supply voltage is below a first threshold, a second value when the power amplifier supply voltage rises above the first threshold, a third value when the power amplifier supply voltage rises above a second threshold, the second value when the power amplifier supply voltage drops below a third threshold, and the first value when the power amplifier supply voltage drops below a fourth threshold.

In some embodiments, the second value is half the first value and the third value is zero.

In some embodiments, the first threshold is approximately 3.8 V, the second threshold is approximately 4.2 V, the third threshold is approximately 4.0 V, and the fourth threshold is approximately 3.6 V.

In some embodiments, the at least one of the one or more bias signals is decreased when the power amplifier supply voltage is increased.

In some embodiments, the at least one of the one or more bias signals is further based on a sensed temperature.

In some embodiments, the one or more bias terminals includes a driver stage bias terminal and an output stage bias terminal.

In some embodiments, the one or more bias terminals includes a peaking amplifier bias terminal and a carrier amplifier bias terminal.

In some embodiments, the one or more bias terminals includes a common base bias terminal and a common emitter bias terminal.

In some embodiments, the one or more bias terminals includes a bias boost terminal.

In some implementations, the present disclosure relates to a radio-frequency (RF) module. The RF module includes a packaging substrate configured to receive a plurality of components. The RF module also includes a power amplification system implemented on the packaging substrate, the power amplification system including a power amplifier including an RF input terminal for receiving an RF signal, an RF output terminal for providing an amplified RF signal, a supply voltage terminal for receiving a power amplifier supply voltage to power the power amplifier, and one or more bias terminals for receiving one or more bias signals, the power amplification system further including a bias controller configured to provide the one or more bias signals to the one or more bias terminals, at least one of the one or more bias signals being based on the power amplifier supply voltage.

In some embodiments, the bias controller is implemented as a CMOS (complementary metal-oxide semiconductor) chip.

In some implementations, the present disclosure relates to a wireless device. The wireless device includes a transceiver configured to generate a radio-frequency (RF) signal. The wireless device also includes a front-end module (FEM) in communication with the transceiver, the FEM including a packaging substrate configured to receive a plurality of components, the FEM further including a power amplification system implemented on the packaging substrate, the power amplification system including a power amplifier including an RF input terminal for receiving the RF signal, an RF output terminal for providing an amplified RF signal, a supply voltage terminal for receiving a power amplifier supply voltage to power the power amplifier, and one or more bias terminals for receiving one or more bias signals, the power amplification system further including a bias controller configured to provide the one or more bias signals to the one or more bias terminals, at least one of the one or more bias signals being based on the power amplifier supply voltage. The wireless device further includes an antenna in communication with the FEM, the antenna configured to transmit the amplified RF signal received from the power amplification system.

In some implementations, the present disclosure relates to a method of biasing a power amplifier. The method includes determining a supply voltage of a power amplifier. The method also includes determining one or more bias signals for the power amplifier based on the supply voltage. The method further includes applying the one or more bias signals to the power amplifier.

In some embodiments, determining the supply voltage includes receiving a supply voltage to power a bias controller.

In some embodiments, determining the one or more bias signals includes determining a decreased bias signal in response to determining an increased supply voltage.

In some embodiments, the method further includes determining a temperature, the one or more bias signals being determined based on the temperature.

In some embodiments, applying the one or more bias signals to the power amplifier includes applying two or more bias signals to two or more bias signal terminals of the power amplifier.

In some embodiments, applying the one or more bias signals to the power amplifier includes applying a bias boost signal to a bias boost terminal of the power amplifier.

DETAILED DESCRIPTION OF SOME EMBODIMENTS

The headings provided herein, if any, are for convenience only and do not necessarily affect the scope or meaning of the claimed invention.

Power amplification systems are often powered using a supply voltage (e.g., from a battery). In some implementations, the voltage from the battery is regulated (e.g., with a buck converter) to a fixed value to compensate for variations in the voltage output from the battery due to manufacturing variation, age, temperature, or other effects. Failure to employ such a regulator can result in a change in the compression characteristics of the power amplifier and degrade its linearity. However, use of a regulator increases the overall cost of the system.

Disclosed herein are various examples of circuits, devices and methods that can be configured to, among other things, address the foregoing challenges associated with power amplification systems. In some implementations as described herein, a bias controller generates one or more bias signals for a power amplifier, at least one of which is based on the supply voltage provided to the power amplifier.

Figure 1:
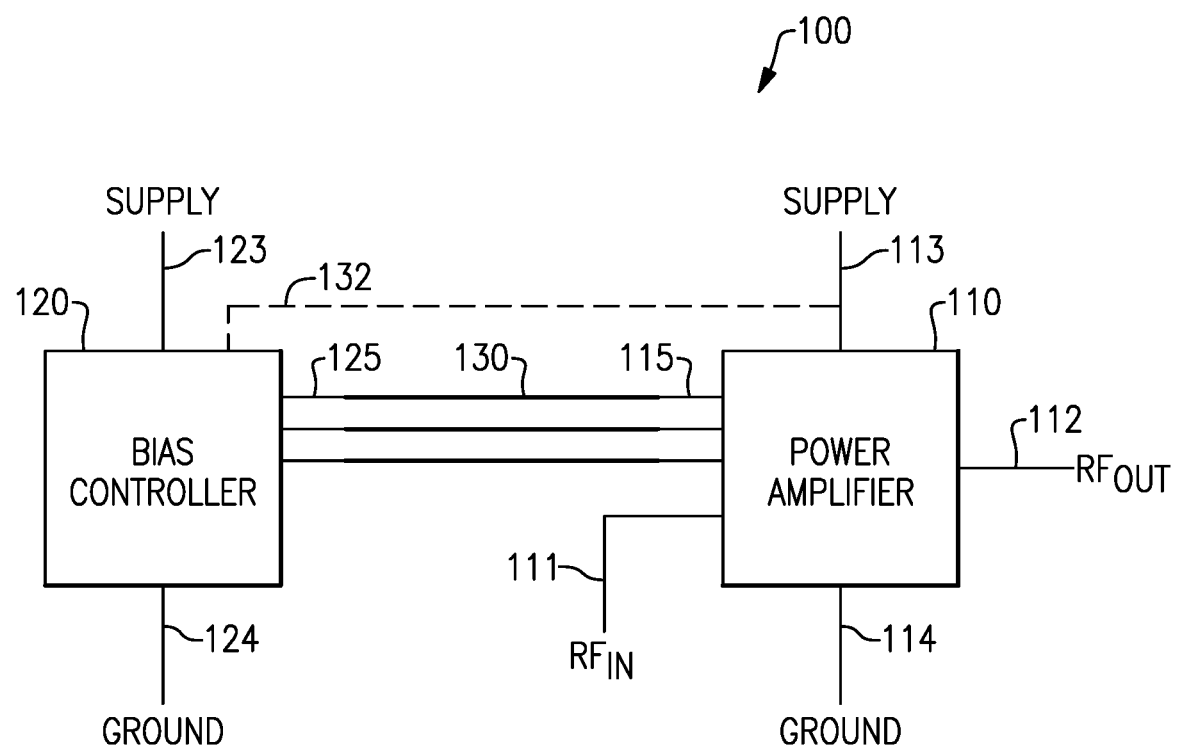
FIG. 1 is a diagram illustrating an example power amplification system, according to some embodiments of the present disclosure.

FIG. 1 schematically shows an example wireless communication configuration 100 that includes a power amplifier 110 and a bias controller 120 that provides one or more bias signals to the power amplifier 110 based on a supply voltage. In some implementations, the bias signals include bias voltages. In some implementations, the bias signals include bias currents.

The power amplifier 110 includes an RFin terminal 111 that receives a radio-frequency (RF) signal to be amplified by the power amplifier 110. The amplified RF signal is provided by the power amplifier 110 via an RFout terminal 112. The power amplifier 110 further includes a supply voltage terminal 113 for receiving a power amplifier supply voltage that powers the power amplifier 110. The power amplifier 110 further includes a ground terminal 114 that is coupled to a ground voltage.

The power amplifier 110 includes one or more bias terminals 115 that are coupled, via one or more lines 130, to corresponding bias terminals 125 of a bias controller 120. The power amplifier 110 receives, via the bias terminals 115, one or more bias signals from the bias controller 120. In some implementations, the bias signals provided by the bias controller 120 are based on the power amplifier supply voltage as described in detail below.

The bias controller 120 includes a supply voltage terminal 123 for receiving a bias controller supply voltage that powers the bias controller 120. The bias controller 120 further includes a ground terminal 124 that is coupled to the ground voltage.

In some implementations, the power amplifier supply voltage (received at the supply voltage terminal 113 of the power amplifier 110) and the bias controller supply voltage (received at the supply voltage terminal 123 of the bias controller 120) are the same voltage or dependent. Thus, in some implementations, the bias controller 120 determines the power amplifier supply voltage based on the voltage received at its supply voltage terminal 123. In some implementations, the power amplifier supply voltage and the bias controller supply voltage are different and/or independent. Thus, in some implementations, the bias controller 120 includes a power amplifier supply voltage terminal 132 for receiving the power amplifier supply voltage or, at least, a signal indicative of the power amplifier supply voltage (e.g., an attenuated amount of the power amplifier supply voltage).

In some implementations, the bias controller 120 is implemented as a CMOS (complementary metal-oxide semiconductor) chip. In some implementations, the bias controller 120 is implemented as a GaAs chip. Similarly, the power amplifier 110 may be implemented on a single CMOS or GaAs chip. As described further below, the bias controller 120 and power amplifier 110 can be implemented in a package, on a common packaging substrate.

Although FIG. 1 illustrates a coupling of the power amplifier supply voltage to the bias terminals via the bias controller 120, the bias signals can be based on the power amplifier supply voltage through other couplings. For example, the supply voltage terminal 113 may be coupled to the bias terminal 115 via a passive circuit (which may be integrated into the power amplifier 110).

FIGS. 2-6 show that, in various embodiments, the bias signals provided by a bias controller can bias a variety of different power amplifiers in a variety of ways.

Figure 2:
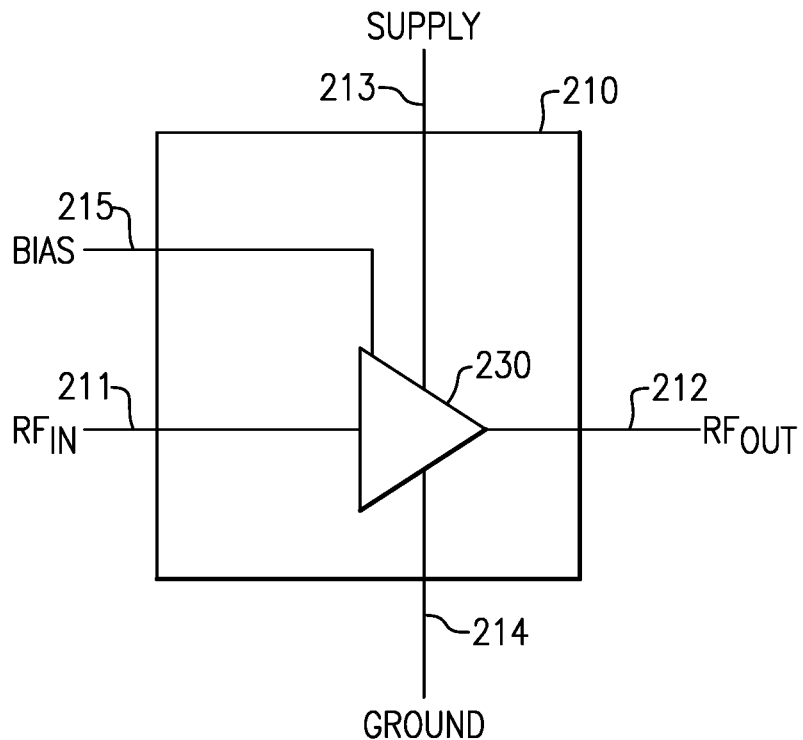
FIG. 2 is a diagram illustrating an example power amplifier, according to some embodiments of the present disclosure.

FIG. 2 shows that, in some implementations, a bias signals from a bias controller can bias a power amplifier stage 230 of a power amplifier 210. In some implementations, the power amplifier stage 230 includes a transistor. The power amplifier 210 of FIG. 2 includes an RF input terminal 211 for receiving an RF signal, an RF output terminal 212 for providing an amplified RF signal, a supply voltage terminal 213 for receiving a power amplifier supply voltage to power the power amplifier 210, a ground terminal 214 for connecting to a ground voltage, and a bias terminal 215 for receiving a bias signal (e.g., from a bias controller). In some implementations, the power amplifier stage 230 includes a transistor having a base coupled to the RF input terminal 211 and the bias terminal 215, a collector coupled to the supply terminal 213 (e.g., via an inductor) and the RF output terminal 211, and an emitter coupled to the ground terminal 214. As described further below, the bias signal provided by the bias controller can be based on the power amplifier supply voltage.

Figure 3:
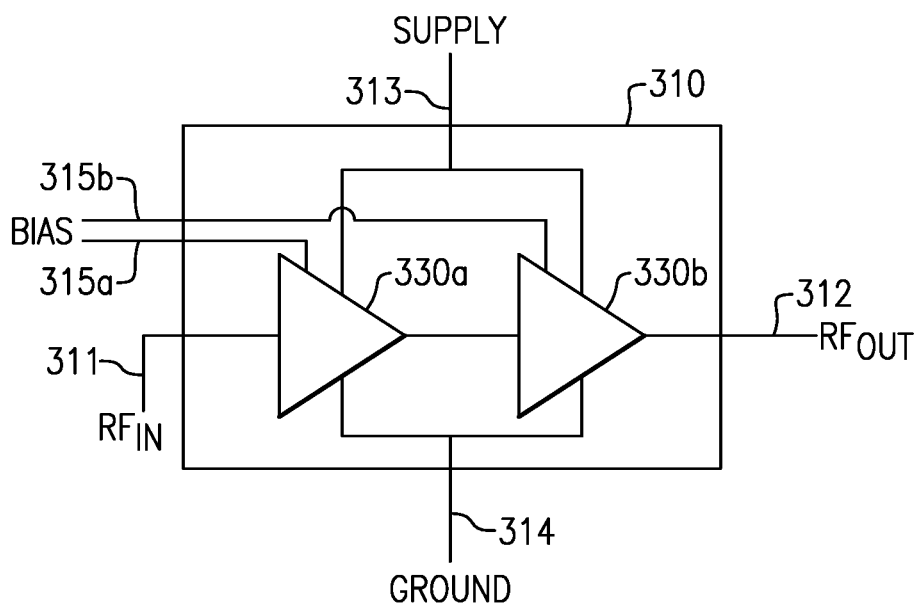
FIG. 3 is a diagram illustrating an example power amplifier, according to some embodiments of the present disclosure.

FIG. 3 shows that, in some implementations, a bias signal from a bias controller can bias a stage 330a-330b of a multi-stage power amplifier 310. The power amplifier 310 of FIG. 3 includes an RF input terminal 311 for receiving an RF signal, an RF output terminal 312 for providing an amplified RF signal, a supply voltage terminal 313 for receiving a power amplifier supply voltage to power the power amplifier 310, a ground terminal 314 for connecting to a ground voltage, and two bias terminals 315a-315b for receiving two bias signal (e.g., from a bias controller). As described further below, at least one of the two bias signals provided by the bias controller can be based on the power amplifier supply voltage. In some implementations, the two bias signals are the same. In some implementations, the two bias signals are different. In some implementations, only one of the two bias signals is based on the power amplifier supply voltage. In some implementations, each of the two bias signals is based on the power amplifier supply voltage.

The power amplifier 310 includes a driver stage bias terminal 315a for receiving a driver stage bias signal that biases a driver stage 330a of the power amplifier 310. Similarly, the power amplifier 310 includes an output stage bias terminal 315b for receiving an output stage bias signal that biases an output stage 330b of the power amplifier 310. Although FIG. 3 illustrates a multi-stage power amplifier 310 with two stages, it is to be appreciated that a multi-stage power amplifier can include three or more stages, each biased by a bias signal received via a respective bias terminal.

Figure 4:
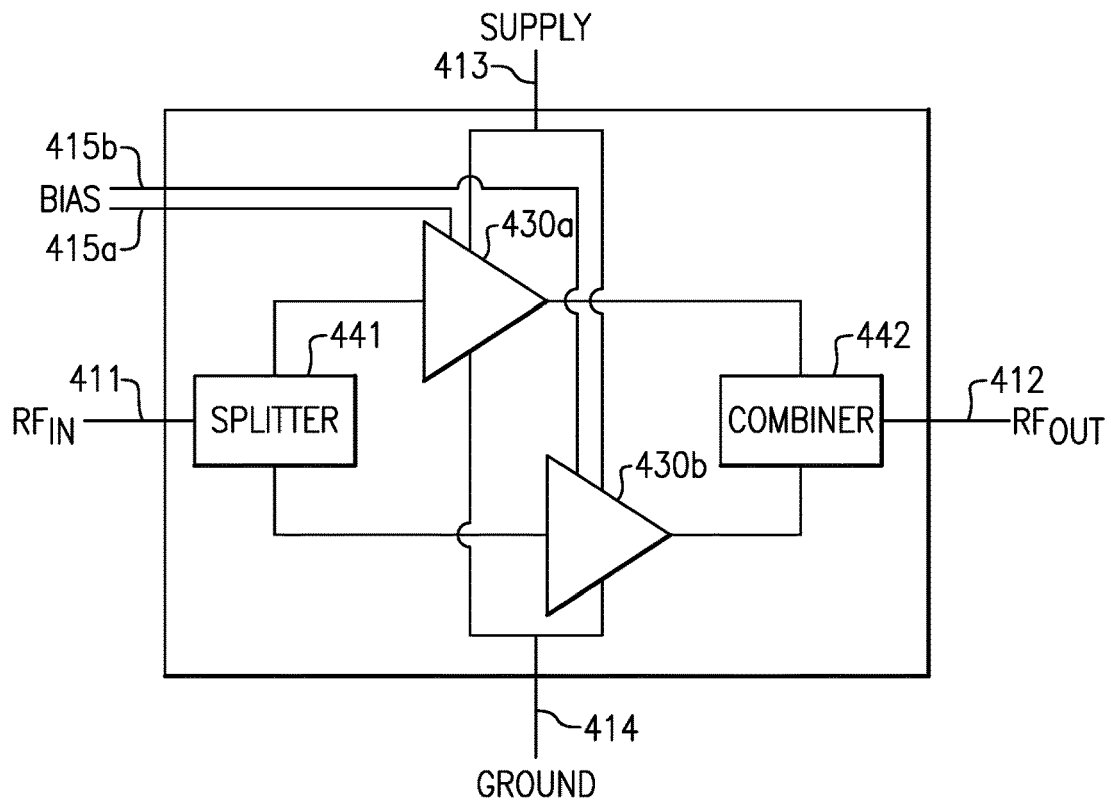
FIG. 4 is a diagram illustrating an example power amplifier, according to some embodiments of the present disclosure.

FIG. 4 shows that, in some implementations, a bias signal from a bias controller can bias an amplifier 430a-430b of a Doherty power amplifier 410. The power amplifier 410 of FIG. 4 includes an RF input terminal 411 for receiving an RF signal, an RF output terminal 412 for providing an amplified RF signal, a supply voltage terminal 413 for receiving a power amplifier supply voltage to power the power amplifier 410, a ground terminal 414 for connecting to a ground voltage, and two bias terminals 415a-415b for receiving two bias signals (e.g., from a bias controller). As described further below, at least one of the two bias signals provided by the bias controller can be based on the power amplifier supply voltage. In some implementations, the two bias signals are the same. In some implementations, the two bias signals are different. In some implementations, only one of the two bias signals is based on the power amplifier supply voltage. In some implementations, each of the two bias signals is based on the power amplifier supply voltage.

The power amplifier 410 includes a peaking amplifier bias terminal 415a for receiving a peaking amplifier bias signal that biases a peaking amplifier 430a of the power amplifier 410. Similarly, the power amplifier 410 includes a carrier amplifier bias terminal 415b for receiving a carrier amplifier bias signal that biases a carrier amplifier 430b of the power amplifier 410. The power amplifier 410 includes a splitter 441 that splits the RF signal into a peaking component (that is fed to the peaking amplifier 430a) and a carrier component (that is fed to the carrier amplifier 430b). The power amplifier 410 further includes a combiner 442 that combines the outputs of the peaking amplifier 430a and the carrier amplifier 430b to produce the amplified RF signal.

Figure 5:
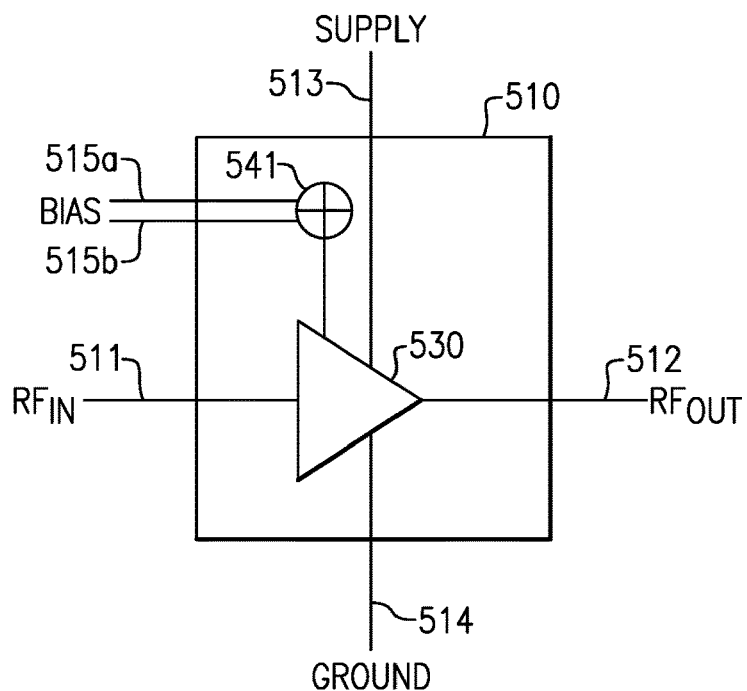
FIG. 5 is a diagram illustrating an example power amplifier, according to some embodiments of the present disclosure.

FIG. 5 shows that, in some implementations, a bias signal from a bias controller can bias a stage 530 of a power amplifier 510 as a primary bias or a bias boost. The power amplifier 510 of FIG. 5 includes an RF input terminal 511 for receiving an RF signal, an RF output terminal 512 for providing an amplified RF signal, a supply voltage terminal 513 for receiving a power amplifier supply voltage to power the power amplifier 510, a ground terminal 514 for connecting to a ground voltage, and two bias terminals 515a-515b for receiving two bias signals (e.g., from a bias controller). As described further below, at least one of the two bias signals provided by the bias controller can be based on the power amplifier supply voltage.

The power amplifier 510 includes a primary bias terminal 515a for receiving a primary bias signal and a bias boost terminal 515b for receiving a bias boost signal. The power amplifier 610 includes a combiner 641 that combines the primary bias signal and the bias boost signal to bias a stage 530 of the power amplifier 510. Although not shown in FIG. 5, in some implementations, the power amplifier 510 can include additional stages biased by voltages from additional bias terminals. Thus, in some implementations, the primary bias terminal 515a and bias boost terminal 515b are coupled to a driver stage and another bias terminal is coupled to an output stage.

Figure 6:
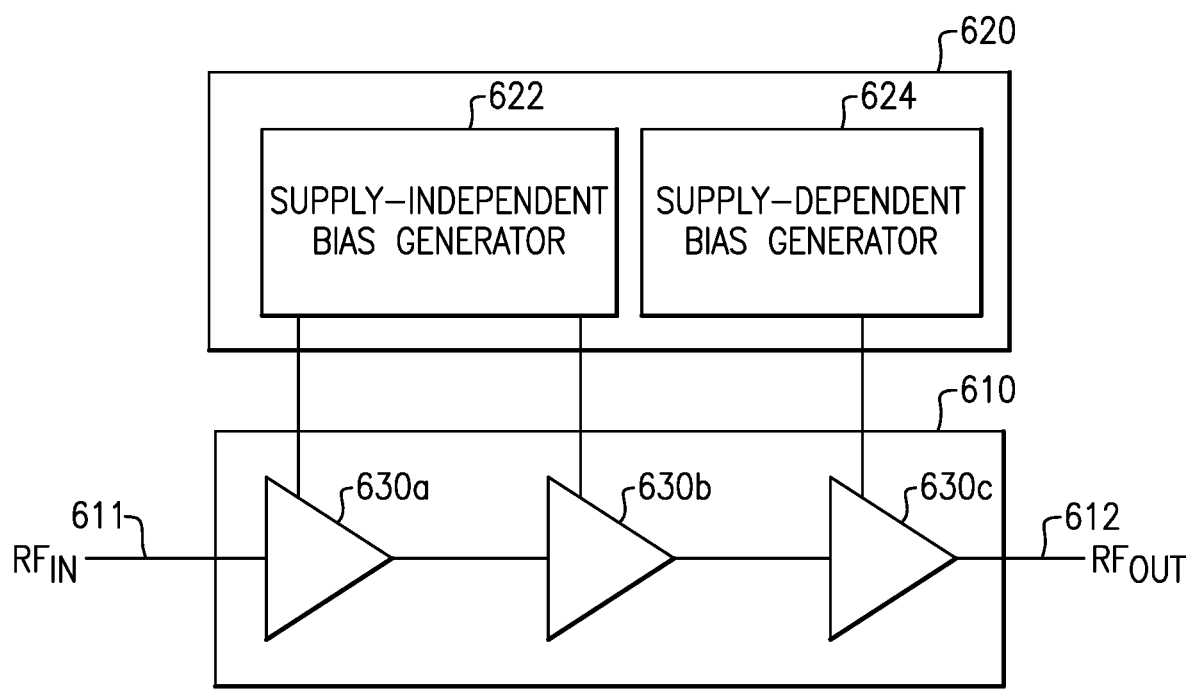
FIG. 6 is a diagram illustrating an example power amplifier, according to some embodiments of the present disclosure.

FIG. 6 shows that, in some implementations, a bias controller 620 can include a supply-independent bias generator 622 and a supply-dependent bias generator 624. The bias controller 620 is configured to provide bias signals to one or more stages 630a-630c of a power amplifier 610. The power amplifier 610 includes The power amplifier 610 of FIG. 6 includes an RF input terminal 611 for receiving an RF signal, an RF output terminal 612 for providing an amplified RF signal, and bias terminals for receiving bias signals from the bias controller 620. As described above, the power amplifier 610 can further include one or more supply terminals for receiving a supply voltage and one or more ground terminals for coupling to a ground voltage.

The bias controller 620 can similarly be coupled to the supply voltage. The bias controller 620 includes a supply-independent bias generator 622 that generates one or more bias signals independent of the supply voltage and a supply-dependent bias generator that generates one or more bias signals based on the supply voltage.

The bias controller 620 determines a power amplifier supply voltage that is provided to the power amplifier 610. In some implementations, the bias controller 620 has a power amplifier supply voltage sense terminal that receives the power amplifier supply voltage or, generally, a signal indicative of the power amplifier supply voltage. For example, in various implementations, the signal can be the power amplifier supply voltage, an attenuated version of the power amplifier supply voltage, a digital signal indicative of whether the power amplifier supply voltage is above or below a threshold, or an analog voltage indicative of an amount that the power amplifier supply voltage exceeds a threshold. Thus, in some implementations, the bias controller 620 measures the power amplifier supply voltage.

In some implementations, the bias controller 620 has a bias controller supply voltage terminal that receives a supply voltage for powering the bias controller 620. In some implementations, the bias controller 620 can determine that the power amplifier supply voltage is the same as the supply voltage for the bias controller 620. Thus, in some implementations, the bias controller 620 measures the bias controller supply voltage.

The bias controller 620, in particular, the supply-dependent bias generator 624, generates one or more bias signals for the power amplifier 610 based on the power amplifier supply voltage. In some implementations, the bias signals include a fixed term and a variable term that is based on the power amplifier supply voltage.

In some implementations, at least one of the one or more bias signals is a continuous function of the power amplifier supply voltage. Thus, in some implementations, the bias controller 620 includes heuristics or formulas for converting the power amplifier supply voltage to the bias signal. For example, in some implementations, the bias signal is linearly proportional to the power amplifier supply voltage.

In some implementations, at least one of the one or more bias signals is a discrete function of the power amplifier supply voltage. Thus, in some implementations, the bias controller 620 includes a table for converting the power amplifier supply voltage to the bias signal. For example, in some implementations, the bias signal is a first value when the power amplifier supply voltage is above a threshold and a second value when the power amplifier supply voltage is below a threshold.

In some implementations, the selected value for the bias signal includes a hysteresis effect, where the bias signal is based on the power amplifier supply voltage at a current time and one or more past times. In some implementations, the bias signal is a first value when the power amplifier rises above a first threshold and a second value when the power amplifier supply voltage drops below a second threshold. For example, the bias signal can be determined as 1.0 V when the power amplifier supply voltage rises above 3.8 V, and remain 1.0 V until the power amplifier supply voltage drops below 3.6 V (when it is, for example, set to 0.7 V).

In some implementations, the bias signal is set using multiple thresholds. In some implementations, the relationship of the power amplifier supply voltage to the multiple thresholds is determined using multiple comparators. In some implementations, a common resistor string is coupled to each of the multiple comparators to reduce current consumption.

In some implementations, the bias signal is set to a first value when the power amplifier supply voltage is below a first threshold, a second value when the power amplifier supply voltage rises above the first threshold, a third value when the power amplifier supply voltage rises above a second threshold, the second value when the power amplifier supply voltage drops below a third threshold, and the first value when the power amplifier supply voltage drops below a fourth threshold.

Specifically, as an example, the bias signal may be a first value when the power amplifier supply voltage is below approximately 3.8 V, reduced to half of the first value when the power amplifier supply voltage rises above approximately 3.8 V, reduced to zero when the power amplifier supply voltage rises above approximately 4.2 V, increased to half the first value when the power amplifier supply voltage drops below approximately 4.0 V, and increased to the first value when the power amplifier supply voltage drops below approximately 3.6 V.

In some implementations, the bias signal is halved by shifting logic inputs of a digital-to-analog converter (DAC). In some implementations, the bias signal is set to zero by applying '0's to the logic inputs of a digital-to-analog converter.

In some implementations, as described above, at least one of the one or more bias signals is decreased when the power amplifier supply voltage is increased. In other implementations, the bias signal is increased when the power amplifier supply voltage is increased.

In some implementations, at least one of the one or more bias signals is further based on a sensed temperature. Thus, the bias controller 620 can include a temperature sense terminal or a built-in temperature sensor to determine the temperature and further base the bias signal on the temperature.

In some implementations, at least one of the one or more bias signals is further based on a modulation or frequency of the radio-frequency signal being amplified by the power amplifier. Thus, the bias controller can include a terminal for receiving modulation and/or frequency information.

The bias controller 620 applies the one or more bias signals to the power amplifier 610. In some implementations, the bias controller applies a supply-independent driver stage bias signal to one or more driver stages 630*a*-630*b* of the power amplifier 610 and a supply-dependent output stage bias signal to an output stage 630*c* of the power amplifier 610. In some implementations, the bias controller 620 applies a peaking amplifier bias signal to a peaking amplifier bias terminal of the power amplifier and a carrier amplifier bias signal to a carrier amplifier bias terminal of a Doherty power amplifier. In some implementations, the bias controller 620 applies a common base bias signal to a common base bias terminal of the power amplifier and a common emitter bias signal to a common emitter bias terminal of a cascode power amplifier. In some implementations, the bias controller applies a bias boost signal to a bias boost terminal of the power amplifier.

Figure 7:
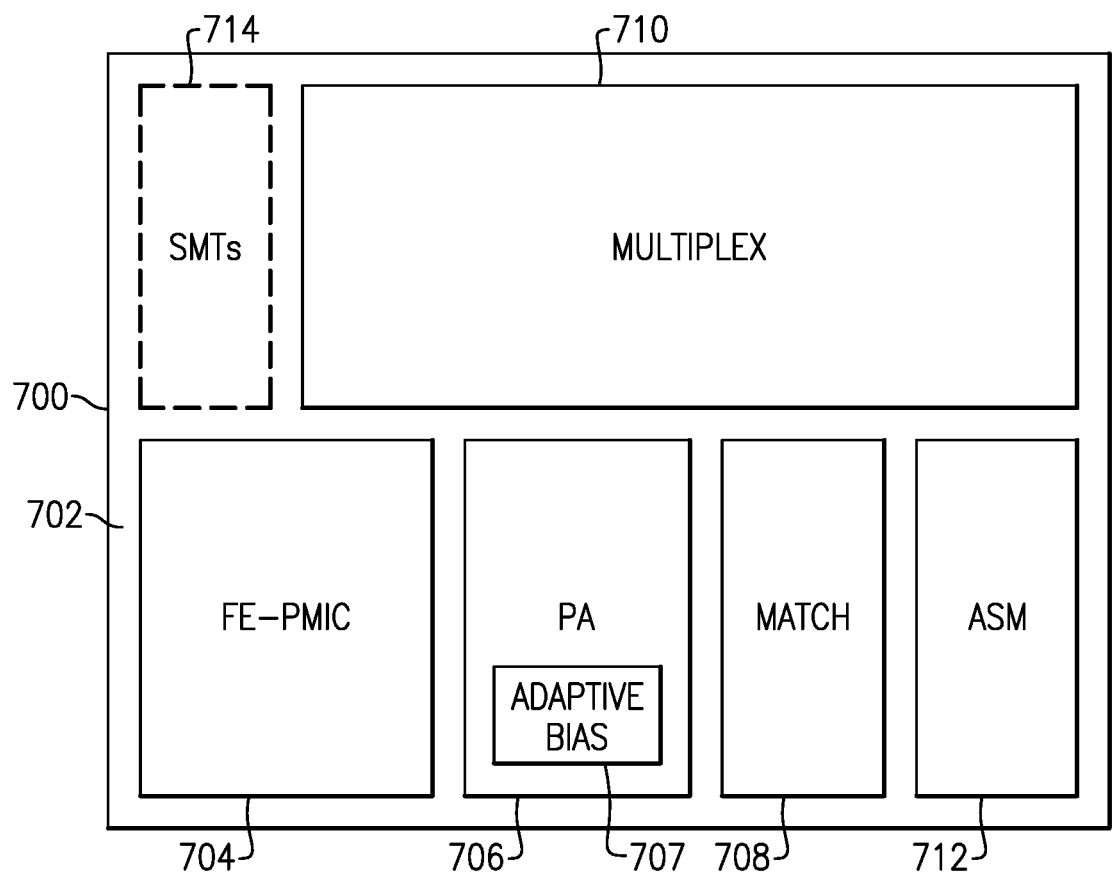
FIG. 7 is a diagram illustrating an example module, according to some embodiments of the present disclosure.

FIG. 7 shows that in some embodiments, some or all of power amplification configurations (e.g., those shown in FIGS. 1-6) can be implemented, wholly or partially, in a module. Such a module can be, for example, a front-end module (FEM). In the example of FIG. 7, a module 700 can include a packaging substrate 702, and a number of components can be mounted on such a packaging substrate 702. For example, an FE-PMIC component 704, a power amplifier assembly 706, a match component 708, and a multiplexer assembly 710 can be mounted and/or implemented on and/or within the packaging substrate 702. The power amplifier assembly 706 may include an adaptive bias module that generates a bias signal based on a power amplifier supply voltage. Other components such as a number of SMT devices 714 and an antenna switch module (ASM) 712 can also be mounted on the packaging substrate 702. Although all of the various components are depicted as being laid out on the packaging substrate 702, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 8:
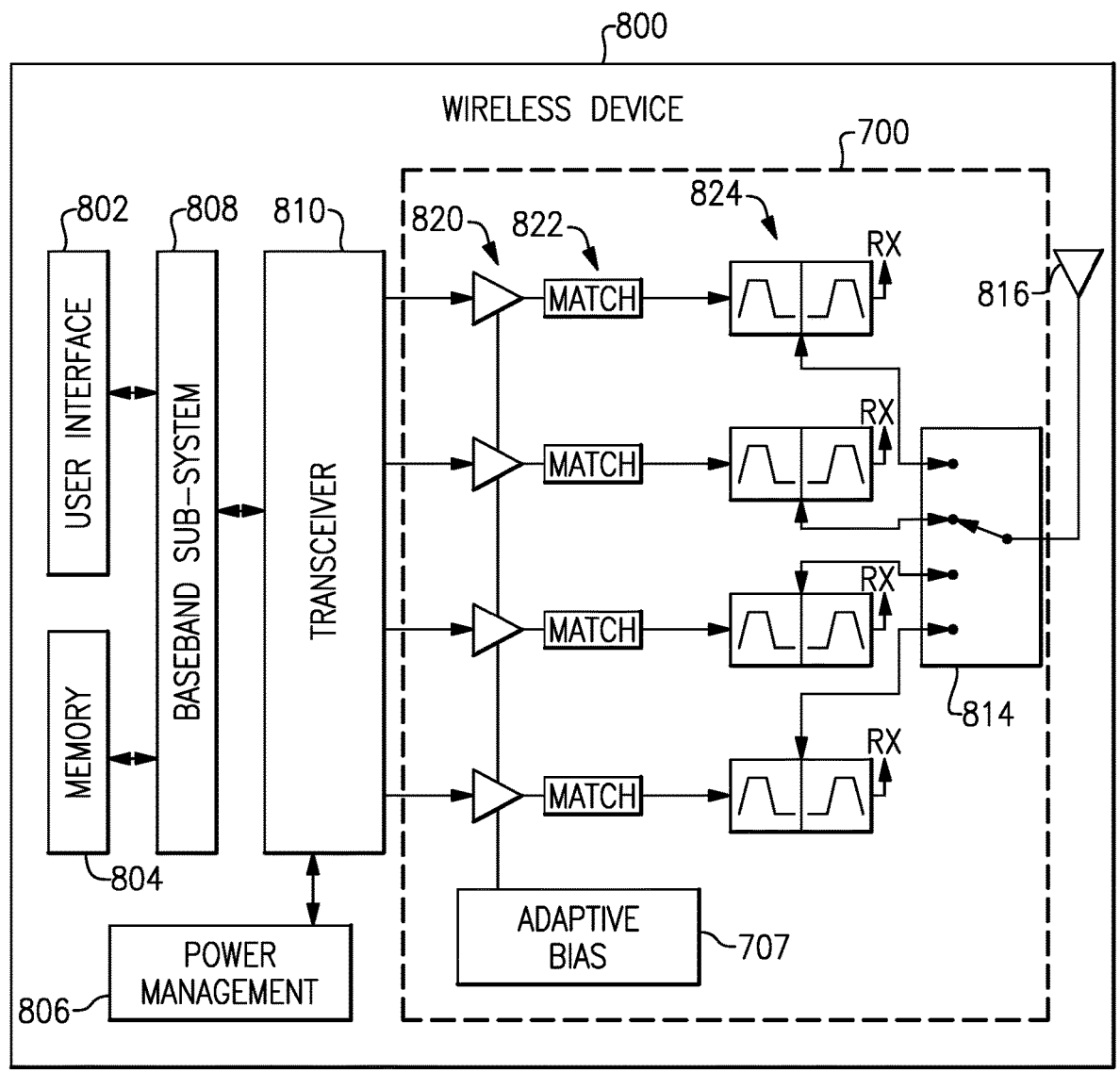
FIG. 8 is a diagram illustrating an example wireless device, according to some embodiments of the present disclosure.

FIG. 8 depicts an example wireless device 800 having one or more advantageous features described herein. In the context of a module having one or more features as described herein, such a module can be generally depicted by a dashed box 700, and can be implemented as, for example, a front-end module (FEM).

Referring to FIG. 8, power amplifiers (PAs) 820 can receive their respective RF signals from a transceiver 810 that can be configured and operated in known manners to generate RF signals to be amplified and transmitted, and to process received signals. The transceiver 810 is shown to interact with a baseband sub-system 808 that is configured to provide conversion between data and/or voice signals suitable for a user and RF signals suitable for the transceiver 810. The transceiver 810 can also be in communication with a power management component 806 that is configured to manage power for the operation of the wireless device 800. Such power management can also control operations of the baseband sub-system 808 and the module 700.

The baseband sub-system 808 is shown to be connected to a user interface 802 to facilitate various input and output of voice and/or data provided to and received from the user. The baseband sub-system 808 can also be connected to a memory 804 that is configured to store data and/or instructions to facilitate the operation of the wireless device, and/or to provide storage of information for the user.

In the example wireless device 800, outputs of the PAs 820 are shown to be matched (via respective match circuits 822) and routed to their respective diplexers 824. Such amplified and filtered signals can be routed to an antenna 816 (or multiple antennas) through an antenna switch 814 for transmission. In some embodiments, the diplexers 824 can allow transmit and receive operations to be performed simultaneously using a common antenna (e.g., 816). In FIG. 8, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplification system comprising:
a power amplifier including a radio-frequency (RF) input terminal for receiving a radio-frequency signal, a radio-frequency output terminal for providing an amplified radio-frequency signal, a supply voltage terminal for receiving a power amplifier supply voltage to power the power amplifier, and one or more bias terminals for receiving one or more bias signals; and
a bias controller configured to provide the one or more bias signals to the one or more bias terminals, at least one of the one or more bias signals being a discrete function of the power amplifier supply voltage, the bias controller further configured to measure the power amplifier supply voltage and select a value of the at least one of the one or more bias signals from a plurality of bias signal values based on a plurality of voltage thresholds.

2. The power amplification system of claim 1 wherein the bias controller includes a supply voltage terminal for receiving a bias controller supply voltage to power the bias controller.

3. The power amplification system of claim 2 wherein the bias controller is configured to determine the power amplifier supply voltage based on the bias controller supply voltage.

4. The power amplification system of claim 2 wherein the bias controller further includes a power amplifier supply voltage terminal for receiving a signal indicative of the power amplifier supply voltage.

5. The power amplification system of claim 1 wherein at least one of the one or more bias signals is a continuous function of the power amplifier supply voltage.

6. The power amplification system of claim 5 wherein the at least one of the one or more bias signals that is a continuous function of the power amplifier supply voltage is linearly proportional to the power amplifier supply voltage.

7. The power amplification system of claim 1 wherein the at least one of the one or more bias signals is a first value when the power amplifier supply voltage is at or above a threshold and a second value when the power amplifier supply voltage is below the threshold.

8. The power amplification system of claim 1 wherein the at least one of the one or more bias signals is a first value when the power amplifier supply voltage is below a first threshold, a second value when the power amplifier supply voltage rises above the first threshold, a third value when the power amplifier supply voltage rises above a second threshold, the second value when the power amplifier supply voltage drops below a third threshold, and the first value when the power amplifier supply voltage drops below a fourth threshold.

9. The power amplification system of claim 1 wherein the at least one of the one or more bias signals is further based on a sensed temperature.

10. The power amplification system of claim 1 wherein the one or more bias terminals include a driver stage bias terminal and an output stage bias terminal.

11. The power amplification system of claim 1 wherein the one or more bias terminals include a peaking amplifier bias terminal and a carrier amplifier bias terminal.

12. The power amplification system of claim 1 wherein the one or more bias terminals include a common base bias terminal and a common emitter bias terminal.

13. The power amplification system of claim 1 wherein the one or more bias terminals include a bias boost terminal.

14. A method of biasing a power amplifier, the method comprising:
   determining a supply voltage of a power amplifier;
   determining one or more bias signals for the power amplifier based on the supply voltage, at least one of the one or more bias signals being a discrete function of the supply voltage, a value of the at least one of the one or more bias signals selected from a plurality of bias signal values based on a plurality of voltage thresholds; and
   applying the one or more bias signals to the power amplifier.

15. The method of claim 14 wherein determining the supply voltage includes receiving a supply voltage to power a bias controller.

16. The method of claim 14 wherein determining the one or more bias signals includes determining a decreased bias signal in response to determining an increased supply voltage.

17. The method of claim 14 further comprising determining a temperature, the one or more bias signals being determined based on the temperature.

18. The method of claim 14 wherein applying the one or more bias signals to the power amplifier includes applying two or more bias signals to two or more bias signal terminals of the power amplifier.

19. The method of claim 14 wherein applying the one or more bias signals to the power amplifier includes applying a bias boost signal to a bias boost terminal of the power amplifier.

20. A wireless device comprising:
   a transceiver configured to generate a radio-frequency (RF) signal;
   a front-end module (FEM) in communication with the transceiver, the front-end module including a packaging substrate configured to receive a plurality of components, the front-end module further including a power amplification system implemented on the packaging substrate, the power amplification system including a power amplifier including a radio-frequency input terminal for receiving the radio-frequency signal, a radio-frequency output terminal for providing an amplified radio-frequency signal, a supply voltage terminal for receiving a power amplifier supply voltage to power the power amplifier, and one or more bias terminals for receiving one or more bias signals, the power amplification system further including a bias controller configured to provide the one or more bias signals to the one or more bias terminals, at least one of the one or more bias signals being a discrete function of the power amplifier supply voltage, the bias controller further configured to measure the power amplifier supply voltage and select a value of the at least one of the one or more bias signals from a plurality of bias signal values based on a plurality of voltage thresholds; and
   an antenna in communication with the front-end module, the antenna configured to transmit the amplified radio-frequency signal received from the power amplification system.

* * * * *